US012550448B2

United States Patent
Zhou et al.

(10) Patent No.: US 12,550,448 B2
(45) Date of Patent: Feb. 10, 2026

(54) PROTECTION DIODE TO PREVENT CHARGE DAMAGE DURING MOL

(71) Applicant: INTERNATIONAL BUSINESS MACHINES CORPORATION, Armonk, NY (US)

(72) Inventors: Huimei Zhou, Albany, NY (US); Terence Hook, Jericho Center, VT (US); Junli Wang, Slingerlands, NY (US); Miaomiao Wang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 631 days.

(21) Appl. No.: 17/947,524

(22) Filed: Sep. 19, 2022

(65) Prior Publication Data
US 2024/0096871 A1 Mar. 21, 2024

(51) Int. Cl.
*H10D 89/60* (2025.01)

(52) U.S. Cl.
CPC ......... *H10D 89/611* (2025.01); *H10D 89/921* (2025.01)

(58) Field of Classification Search
CPC ........................... H10D 89/921; H10D 89/611
See application file for complete search history.

(56) References Cited

U.S. PATENT DOCUMENTS

| | | | |
|---|---|---|---|
| 6,048,761 A | 4/2000 | En et al. | |
| 6,432,726 B2 | 8/2002 | Iranmanesh et al. | |
| 7,269,076 B2 | 9/2007 | Joo et al. | |
| 7,804,317 B1 | 9/2010 | Parameshwaran et al. | |
| 2012/0170163 A1 | 7/2012 | Mikolajczak et al. | |
| 2013/0027114 A1* | 1/2013 | Petruzzi | H03K 17/18 327/437 |
| 2020/0091138 A1* | 3/2020 | Liang | H10D 89/611 |
| 2020/0112169 A1* | 4/2020 | Bao | G01R 1/36 |
| 2023/0116600 A1* | 4/2023 | Chen | H01L 23/5256 257/213 |

FOREIGN PATENT DOCUMENTS

EP 0614223 A1 2/1993

OTHER PUBLICATIONS

Shin, H., Ma, Z. J., & Hu, C. (Dec. 5, 1993). Impact of plasma charging damage and diode protection on scaled thin oxide. In Proceedings of IEEE International Electron Devices Meeting (pp. 467-470). IEEE.

(Continued)

*Primary Examiner* — Steven M Page
(74) *Attorney, Agent, or Firm* — Tutunjian & Bitetto, P.C.; Jeffrey Kelly

(57) ABSTRACT

An integrated circuit is presented including a protection diode including a plurality of first gates and a plurality of first source/drain (S/D) contacts and a device under test (DUT) including a plurality of second gates and a plurality of second S/D contacts, the DUT being electrically connected to the protection diode by either at least one gate contact or at least on CA contact or at least one buried power rail (BPR). The protection diode is electrically connected to the DUT by middle-of-line (MOL) layers for gate oxide protection before M1 formation.

20 Claims, 7 Drawing Sheets

(56) References Cited

OTHER PUBLICATIONS

Chao, Y. J., Yang, K. W., Su, C., Lin, C. J., & King, Y. C. (Dec. 16, 2021). Wide range detector of plasma induced charging effect for advanced CMOS BEOL processes. Nanoscale Research Letters, 16(1), 1-6.

Wang, Z., Ackaert, J., Scarpa, A., Salm, C., Kuper, F. G., & Vugts, M. (May 9, 2005). Strategies to cope with plasma charging damage in design and layout phases. In 2005 International Conference on Integrated Circuit Design and Technology, 2005. ICICDT 2005. (pp. 91-98). IEEE.

* cited by examiner

PROTECTION DIODE TO PREVENT CHARGE DAMAGE DURING MOL

BACKGROUND

The present invention relates generally to semiconductor devices, and more specifically, to an integrated circuit for preventing charge damage during wafer bonding and middle-of-line (MOL) processing.

Electro Static Discharge (ESD) is an issue affecting integrated circuits (ICs). In IC technology, the maximum rating of the components specified in a design should be satisfied in the fabrication stage. When the current and voltage applied to the IC are above the maximum rating, the components are subjected to Electric Over Stress (EOS) due to ESD. Design engineers are constantly investigating what causes ESD and how to prevent it, as it may contribute to failure and reliability issues. Preventing ESD is beneficial in protecting devices from damage and preventing malfunction. An ESD diode, also known as an ESD protection diode, is a protection diode used as a countermeasure for static electricity discharge in ICs. The ESD diode absorbs the abnormal voltages from interfaces or external terminals and suppresses the ESDs and transient voltage pulses.

SUMMARY

In accordance with an embodiment, an integrated circuit is provided. The integrated circuit includes a protection diode including a plurality of first gates and a plurality of first source/drain (S/D) contacts and a device under test (DUT) including a plurality of second gates and a plurality of second S/D contacts, the DUT being electrically connected to the protection diode by at least one gate contact.

In accordance with another embodiment, an integrated circuit is provided. The integrated circuit includes a protection diode including a plurality of first gates and a plurality of first source/drain (S/D) contacts and a device under test (DUT) including a plurality of second gates and a plurality of second S/D contacts, the DUT being electrically connected to the protection diode by at least one additional S/D contact.

In accordance with yet another embodiment, an integrated circuit is provided. The integrated circuit includes a protection diode including a plurality of first gates and a plurality of first source/drain (S/D) contacts and a device under test (DUT) including a plurality of second gates and a plurality of second S/D contacts, the DUT being electrically connected to the protection diode by at least one buried power rail (BPR).

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
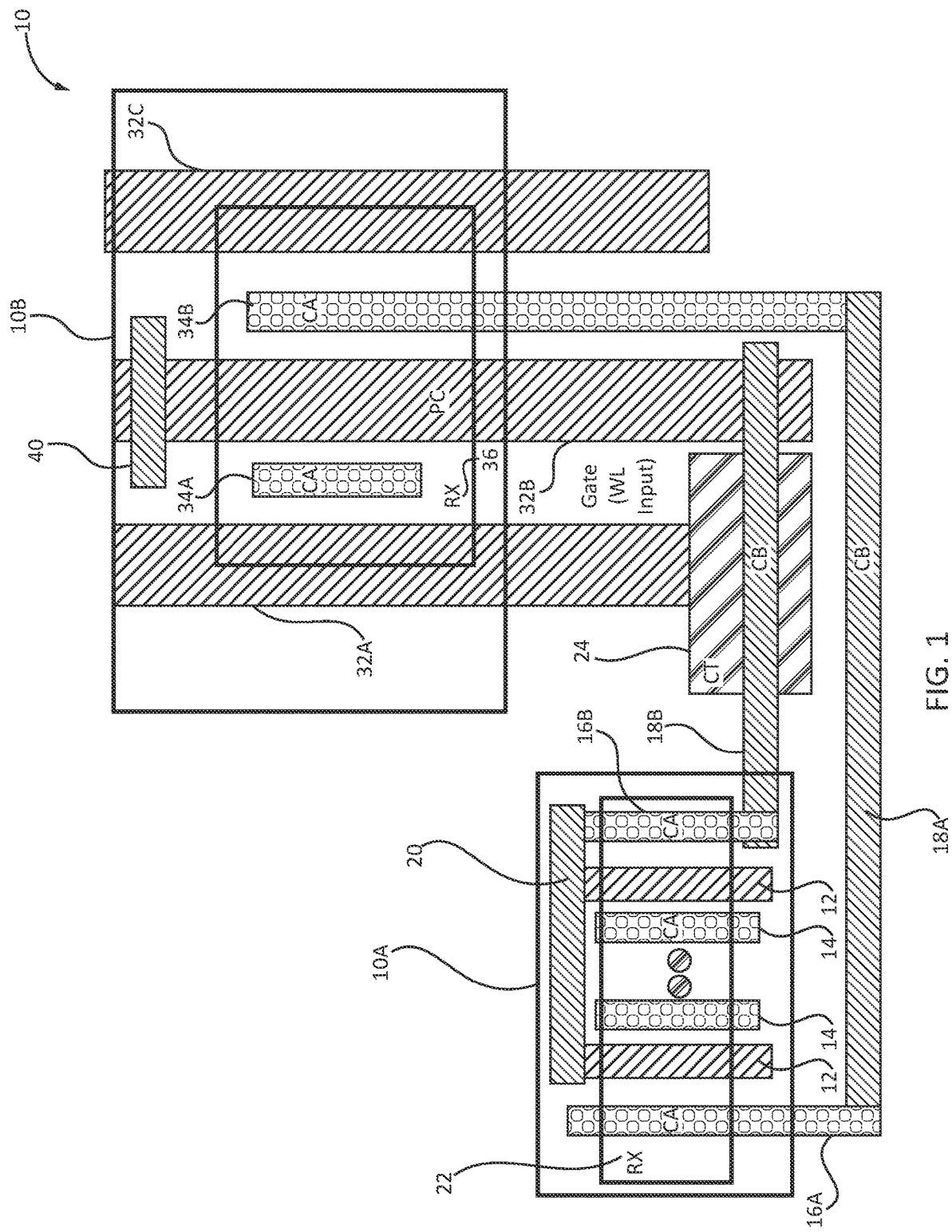
FIG. 1 is a top view of an integrated circuit illustrating a protection diode connected to a device under test (DUT) or array or circuit where a gate contact is employed for wiring out, in accordance with an embodiment of the present invention.

Embodiments in accordance with the present invention provide methods and devices for presenting novel structures where a protection diode is connected to a device under test (DUT) or array or circuit such that either the gate contact is employed for wiring out or the source/drain (S/D) contact is employed for wiring out or a buried power rail (BPR) is employed for wiring out. The protection diode is connected in the middle-of-line (MOL) (by either CB contact (gate contact) or CA contact (S/D contact) or BPR) before M1 formation in order to protect charging from MOL to M1.

When charged bodies come in contact, there is a sudden flow of charges which generate static electricity. The static electricity in integrated circuits (ICs) induces voltage and current spikes that ruin the purpose of the devices. Electro Static Discharge (ESD) protection prevents high voltages and currents generated from the ESD strike from reaching the ICs. ESD diodes are connected between the interface connectors and the ICs in order to be protected. By placing the ESD in the signal line, the Electric Over Stress (EOS) is prevented from damaging the ICs.

The ESD strike creates large current spikes that flow through other devices, creating a high voltage drop. If the voltage drop is above the maximum voltage rating of each component, it can cause circuit issues such as EOS, electromigration, and gate oxide stress.

The ESD diode absorbs the short-duration voltage pulses during the ESD strike. The ESD diode breaks down and forms a low impedance between the interface and the ICs. The high peak currents from the ESD strike flow to the ground through the ESD diode and limit the ESD strike voltages from damaging the ICs. The ESD diode is connected in a reversed biased condition, and is operated at the region before the breakdown region.

During metal/dielectric plasma processing from middle-of-line (MOL) to the back-end-of-line (BEOL), degradation of the transistor gate oxide may occur due to the plasma discharge current. This degradation can create a functional failure or lead to future reliability issues. Diodes of a specific size are incorporated into the chip to protect from plasma induced damage (PID) during processing. In 3D ICs, additional processes such as through silicon via (TSV) etching and backside redistribution layer (RDL) are accounted for in deciding the diode size. An additional diode protection structure is also used for ESD damage during fab/assembly. The exemplary embodiments of the present invention present novel structures where a protection diode is connected to a device under test (DUT) or array or circuit such that either the gate contact is employed for wiring out or the source/drain (S/D) contact is employed for wiring out or a buried power rail (BPR) is employed for wiring out to prevent charge damage during MOL.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a top view of an integrated circuit illustrating a protection diode connected to a device under test (DUT) or array or circuit where a gate contact is employed for wiring out, in accordance with an embodiment of the present invention.

In recent years, the evolution of semiconductor process technology continues to scale down the critical dimension in large-scale integrated circuits. Advanced FinFET logic processes have become more complex for realizing more tightly packed transistors in multi-functional and more powerful silicon (Si) chips. Reactive ion etching (RIE) steps enhanced by plasma become inevitable in advanced nano-scale processes for achieving high aspect ratio structures which are essential for high packing density circuits. For complementary metal-oxide semiconductor (CMOS) technology nodes beyond 45 nm, the transistor gates changed from the conventional poly-silicon gate with silicon dioxide to high-k metal gate (HKMG) stacks. This change makes the devices more susceptible to the plasma induced damage and might lead to unforeseen latent damages to the high-k dielectric layers. In state-of-the-art manufacturing processes of Fin-FETs, numerous RF plasma steps such as etching, deposition and cleaning processes are inevitable, which create higher frequencies of plasma induced charging (PID) events. Both positive and negative charging on metal structures may occur. As these charges flow through the conductive paths made of pre-existing metal lines, via and contacts, the undesirable discharging through vulnerable parts of the circuits, particularly through the transistor gate dielectric may lead to reliability concerns. For instance, in the dry etching step, scattering impinging ions and sputtered materials at the reaction surface cause more defects in the bulk fins. To avoid the plasma charging event leading to irreversible damage to circuits, design rules that limit the size of metal structures are given. Another example of alleviating PID includes using protective diodes, which could shunt the plasma charging current away from sensitive circuits.

Conventionally, on-wafer test patterns have been used to monitor the PID levels. The most common and widely used parameter for monitoring on-wafer PID is the time-to-breakdown (TDDB) characteristics of the transistor gates with large antenna structures. The latent damage on gate dielectrics can be revealed by measuring the degradation of the gate dielectric layer under voltage or current stress tests. Hence, these patterns are not able to provide real-time feedback on the plasma processes.

However, referring back to FIG. 1, the integrated circuit (IC) 10 prevents charging damage during wafer bonding and middle-of-line (MOL) processing. The IC 10 includes a protection diode 10A electrically and physically connected to a device under test (DUT) 10B, which can also be an array or a circuit.

The protection diode 10A includes gates 12 and CA contacts 14 formed between the gates 12. A CA contact 16A to the left of the leftmost gate 12 is connected to a CB contact 18A, which in turn is connected to a CA contact 34B of the DUT 10B. Thus, the gate contact or CB contact 18A is employed to wire the protection diode 10A to the DUT 10B. CA contacts can also be referred to as source/drain (S/D) contacts and CB contacts can also be referred to as gate contacts. Moreover, a CA contact 16B to the right of the rightmost gate 12 is connected to a CB contact 18B, which in turn is connected to a second gate 32B of the DUT 10B. Thus, the gate contact or CB contact 18B is also employed to wire the protection diode 10A to the DUT 10B. Therefore, two gate contacts or two CB contacts, that is, the gate contacts 18A and 18B are wired out to the DUT 10B. The gates 12 and the CA contacts 14, 16A, 16B are positioned in the active region or active layer 22. Another gate contact 20 can also be formed in the protection diode 10A, above the active layer 22.

The DUT 10B includes a first gate 32A, a second gate 32B, and a third gate 32C. The first gate 32A is connected to a gate cut 24, the second gate 32B is connected to the CB contact or gate contact 18B, and the third gate 32C is not shown connected to any other component. The first, second, and third gates 32A, 32B, and 32C can also be referred to as word lines (WLs). A CA contact 34A is positioned between the first gate 32A and the second gate 32B. A CA contact 34B is connected between the second gate 32B and the third gate 32C. The first, second, and third gates 32A, 32B, 32C and the CA contacts 34A, 34B are positioned in the active region or active layer 36. Another gate contact 40 can also be formed in the DUT 10B such that it directly contacts, e.g., the second gate 32B. As noted above, the second gate 32B of the DUT 10B electrically connects to the gate contact 18B of the protection diode 10A and the CA contact 34B of the DUT 10B electrically connects to the gate contact 18A of the protection diode 10A. As a result, the protection diode 10A and the DUT 10B are electrically connected by two gate contacts or two CB contacts, that is the gate contacts or the CB contacts 18A, 18B. In other words, gate contacts are employed for the wiring out.

Figure 2:
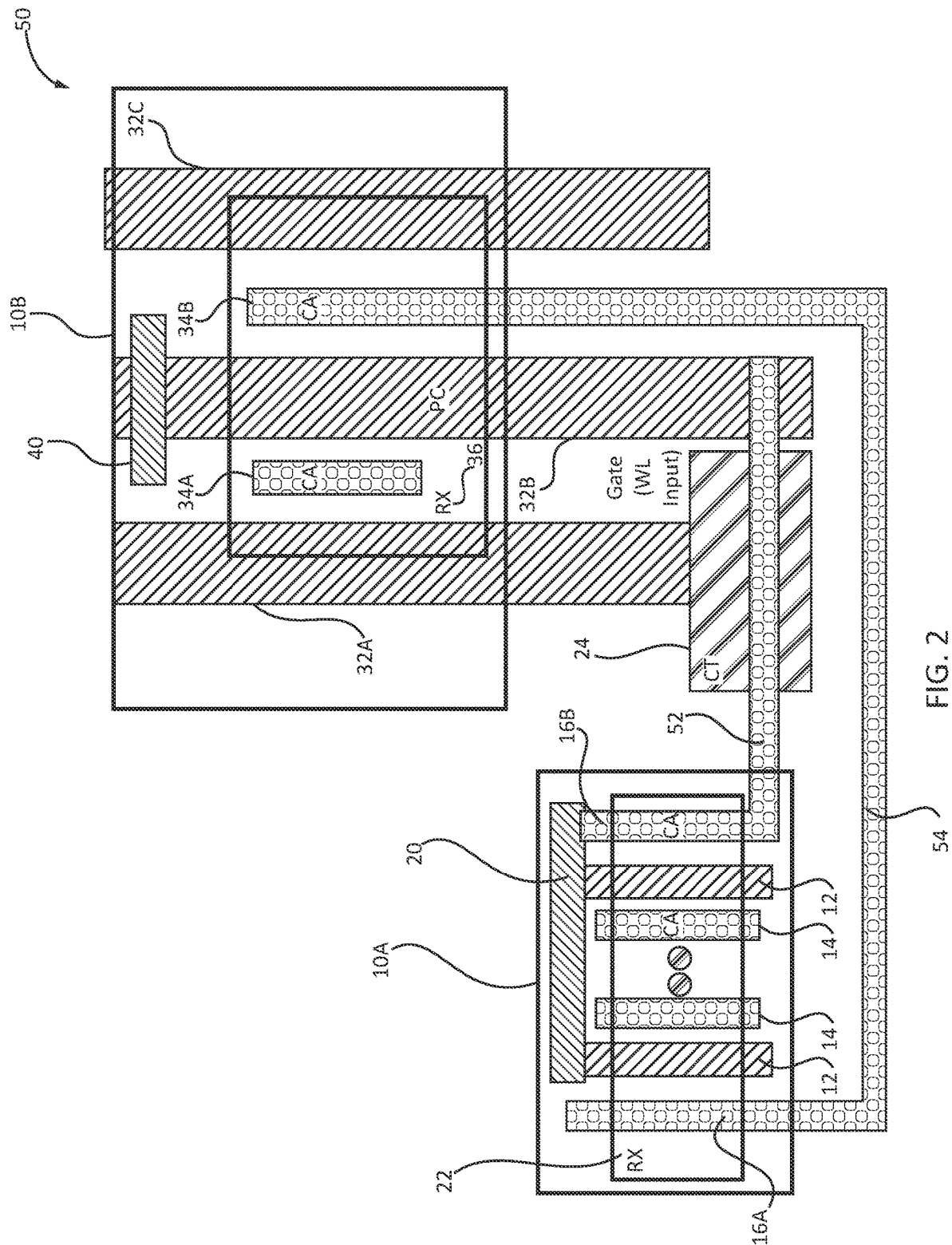
FIG. 2 is a top view of an integrated circuit illustrating a protection diode connected to a device under test (DUT) or array or circuit where a source/drain (S/D) contact is employed for wiring out, in accordance with another embodiment of the present invention.

FIG. 2 is a top view of an integrated circuit illustrating a protection diode connected to a device under test (DUT) or array or circuit where a source/drain (S/D) contact is employed for wiring out, in accordance with another embodiment of the present invention.

The integrated circuit (IC) 50 prevents charging damage during wafer bonding and middle-of-line (MOL) processing. The IC 50 includes a protection diode 10A electrically and physically connected to a device under test (DUT) 10B, which can also be an array or a circuit.

The protection diode 10A includes gates 12 and CA contacts 14 formed between the gates 12. A CA contact 16A to the left of the leftmost gate 12 is connected to a CA contact 54, which in turn is connected to a CA contact 34B of the DUT 10B. Thus, another or additional CA contact 54 is employed to wire the protection diode 10A to the DUT 10B. CA contacts can also be referred to as source/drain (S/D) contacts and CB contacts can also be referred to as gate contacts. Moreover, a CA contact 16B to the right of the rightmost gate 12 is connected to a CA contact 52, which in turn is connected to the second gate 32B of the DUT 10B. Thus, another or an additional CA contact 52 is also employed to wire the protection diode 10A to the DUT 10B. Therefore, CA contacts or S/D contacts 52 and 54 are wired out to the DUT 10B. The gates 12 and CA contacts 14, 16A, 16B are positioned in the active region or active layer 22. Another gate contact 20 can also be formed in the protection diode 10A over the active layer 22.

The DUT 10B includes a first gate 32A, a second gate 32B, and a third gate 32C. The first gate 32A is connected to the gate cut 24, the second gate 32B is connected to the CA contact or S/D contact 52, and the third gate 32C is not shown connected to any other component. A CA contact 34A is positioned between the first gate 32A and the second gate 32B. A CA contact 34B is connected between the second gate 32B and the third gate 32C. The first, second, and third gates 32A, 32B, 32C and the CA contacts 34A, 34B are positioned in the active region or active layer 36. Another gate contact 40 can also be formed in the DUT 10B such that it directly contacts the second gate 32B. As noted above, the second gate 32B of the DUT 10B electrically connects to the S/D contact 52 of the protection diode 10A and the CA contact 34B of the DUT 10B electrically connects to the S/D contact 54 of the protection diode 10A. As a result, the protection diode 10A and the DUT 10B are electrically connected by two S/D contacts or two CA contacts, that is, S/D contacts or CA contacts 52, 54. Stated differently, two CA contact links are created between the protection diode 10A and the DUT 10B. In other words, S/D contacts are employed for the wiring out, in contrast to FIG. 1 which employs gate contacts for wiring out.

Figure 3:
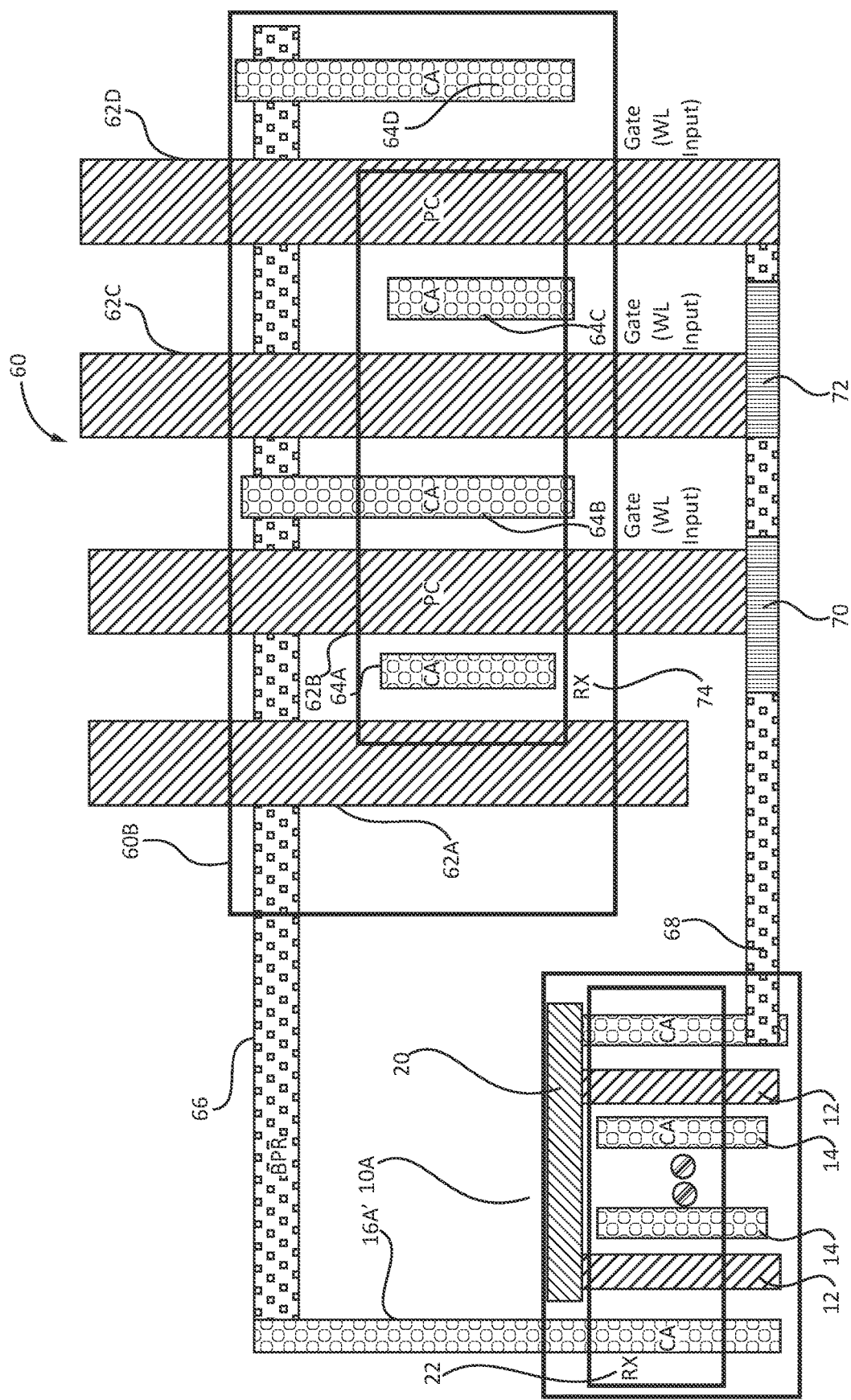
FIG. 3 is a top view of an integrated circuit illustrating a protection diode connected to a device under test (DUT) or array or circuit where a buried power rail (BPR) is employed for wiring out, in accordance with another embodiment of the present invention.

FIG. 3 is a top view of an integrated circuit illustrating a protection diode connected to a device under test (DUT) or array or circuit where a buried power rail (BPR) is employed for wiring out, in accordance with another embodiment of the present invention.

The integrated circuit (IC) 60 prevents charging damage during wafer bonding and middle-of-line (MOL) processing. The IC 60 includes a protection diode 10A electrically and physically connected to a device under test (DUT) 60B, which can also be an array or a circuit.

The protection diode 10A includes gates 12 and CA contacts 14 formed between the gates 12. A CA contact 16A' to the left of the gates 12 is connected to a buried power rail (BPR) 66, which in turn is connected to first, second, third, and fourth gates 62A, 62B, 62C, 62D of the DUT 60B. Thus, the BPR 66 is employed to wire the protection diode 10A to the DUT 60B. The first, second, third, and fourth gates 62A, 62B, 62C, 62D of the DUT 60B can also be referred to as word lines (WLs). Moreover, a CA contact 16B to the right of the rightmost gate 12 is connected to a BPR 68, which in turn is connected to the second, third, and fourth gates 62B, 62C, 62D of the DUT 10B (or a portion of the gates). Thus, the BPR 68 is also employed to wire the protection diode 10A to the DUT 60B. Therefore, both the BPRs 66, 68 are wired out to the DUT 60B. The gates 12 and CA contacts 14, 16A', 16B are positioned in the active region or active layer 22.

The DUT 60B includes a first gate 62A, a second gate 62B, a third gate 62C, and a fourth gate 62D. The second gate 62B is connected to a gate contact 70, the third gate 62C is connected to a gate contact 72, and the fourth gate 62D is connected to the BPR 68. A CA contact 64A is positioned between the first gate 62A and the second gate 62B. A CA contact 64B is connected between the second gate 62B and the third gate 62C. A CA contact 64C is connected between the third gate 62C and the fourth gate 62D. Another CA contact 64D is positioned to the right of the fourth gate 62D. The first, second, third, and fourth gates 62A, 62B, 62C, 62D and the CA contacts 64A, 64B, 64C are positioned in the active region or active layer 74.

The second gate 62B of the DUT 60B electrically connects to the BPR 66 and the BPR 68, which in turn are connected to the protection diode 10A. The third gate 62C of the DUT 60B electrically connects to the BPR 66 and the BPR 68, which in turn are connected to the protection diode 10A. The fourth gate 62D of the DUT 60B electrically connects to the BPR 66 and the BPR 68, which in turn are connected to the protection diode 10A.

The first gate 62A, the second gate 62B, the third gate 62C, and the fourth gate 62D of the DUT 60B are electrically connected to the BPR 66 of the protection diode 10A on the opposed end thereof. As a result, the protection diode 10A and the DUT 60B are electrically connected by the BPRs 66, 68 on opposed ends of the first, second, third, and fourth gates 62A, 62B, 62C, 62D. In other words, the BPRs 66, 68 are employed for the wiring out, in contrast to FIG. 1 which employs gate contacts and in contrast to FIG. 2 which employs S/D contacts.

The BPR 66 can be in parallel to the BPR 68. The BPR 66 can be longer than the BPR 68. The BPR 66 can also directly contacts the CA contact 64B and the CA contact 64D. The BPR 68 does not directly contact any of the CA contacts 64A, 64B, 64C, 64D of the DUT 60B.

Regarding FIGS. 1-3, the gates 12 can be dummy gates composed of any type of sacrificial material or the same material with active gate.

Regarding various dielectrics or dielectric layers discussed herein, the dielectrics can include, but are not limited to, SiN, SiOCN, SiOC, SiBCN, $SO_2$, or ultra-low-k (ULK)

materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Non-limiting examples of suitable conductive materials for the CA and CB contacts include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

Figure 4:
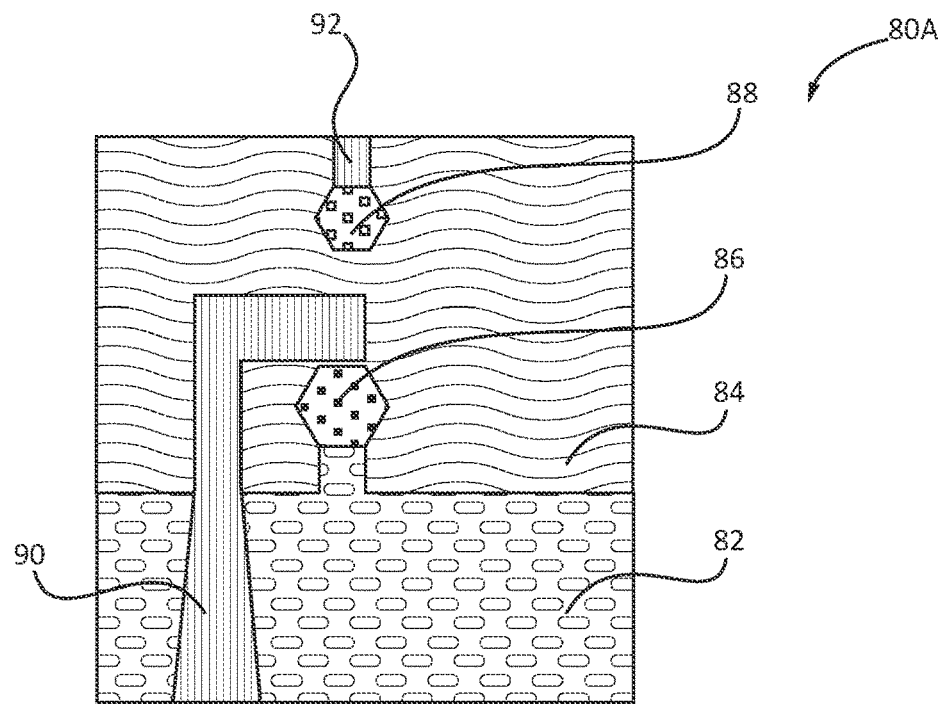
FIG. 4 is a cross-sectional view of a semiconductor structure where the BPR is employed for wiring out, in accordance with an embodiment of the present invention.

FIG. 4 is a cross-sectional view of a semiconductor structure where the BPR is employed for wiring out, in accordance with an embodiment of the present invention.

The cross-sectional view 80A illustrates a bottom S/D epi region 86 formed over a first insulator 82. The bottom S/D epi region 86 is surrounded by a second insulator 84, which also directly contacts the top surface of the first insulator 82. A CA/CB contact 90 extends through the first insulator 82 and the second insulator 84 to directly contact a top surface of the bottom S/D epi region 86. Additionally, a top S/D epi region 88 with a CA/CB contact 92 is formed above the CA/CB contact 90, such that the bottom S/D epi region 86 is vertically aligned with the top S/D epi region 88. This configuration can pertain to a planar field effect transistor (FET) configuration.

Figure 5:
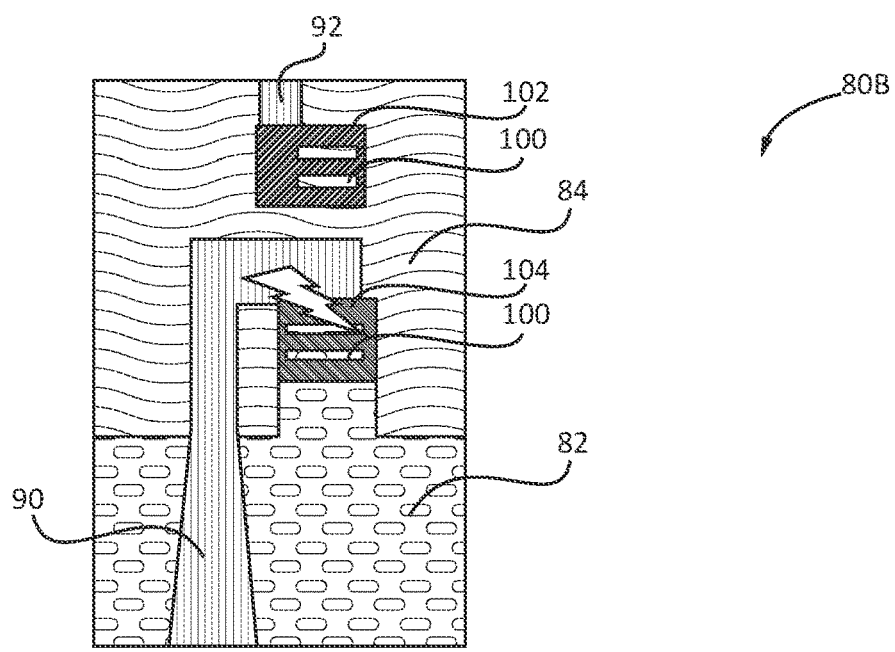
FIG. 5 is a cross-sectional view of a semiconductor structure where a stacked field effect transistor (FET) is used when the BPR is employed for wiring out, in accordance with an embodiment of the present invention.

FIG. 5 is a cross-sectional view of a semiconductor structure where a stacked FET is used when the BPR is employed for wiring out, in accordance with an embodiment of the present invention.

The cross-sectional view 80B illustrates a bottom nanosheet stack 100 surrounded by a bottom work function metal (WFM) 104 formed over the first insulator 82. The bottom WFM 104 is surrounded by the second insulator 84, which also directly contacts the top surface of the first insulator 82. A CA/CB contact 90 extends through the first insulator 82 and the second insulator 84 to directly contact a top surface of the bottom WFM 104. Additionally, a top nanosheet stack 100 surrounded by a top WFM 102 is formed adjacent the top CA/CB contact 92, and above the CA/CB contact 90, such that the bottom WFM 104 is vertically aligned with the top WFM 102. This configuration can pertain to a stacked field effect transistor (FET) configuration.

FIGS. 4 and 5 illustrate that MOL wiring out would be one good choice for protection diode connection with BPR and backside power delivery network (BSPDN) technologies since the gate is hooked to the VO or CA/CB level.

The bottom, top S/D epi regions 86, 88 can be of the same or different materials for pFET and nFET devices, and can be either in-situ doped with appropriate polarity dopants (B for pFET and P for nFET devices) or doped by ion implantation.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The bottom, top WFMs 102, 104 can be deposited by any suitable techniques, such as ALD, CVD, metal-organic CVD (MOCVD), physical vapor deposition (PVD), thermal oxidation, combinations thereof, or other suitable techniques. The gate dielectric material of the bottom, top WFMs 102, 104 can include, e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The bottom, top WFMs 102, 104 can be TiN, TiAl, TiC, TiAlC, etc., and conductive metal fills, such as W, Al, Ru, etc.

Figure 6:
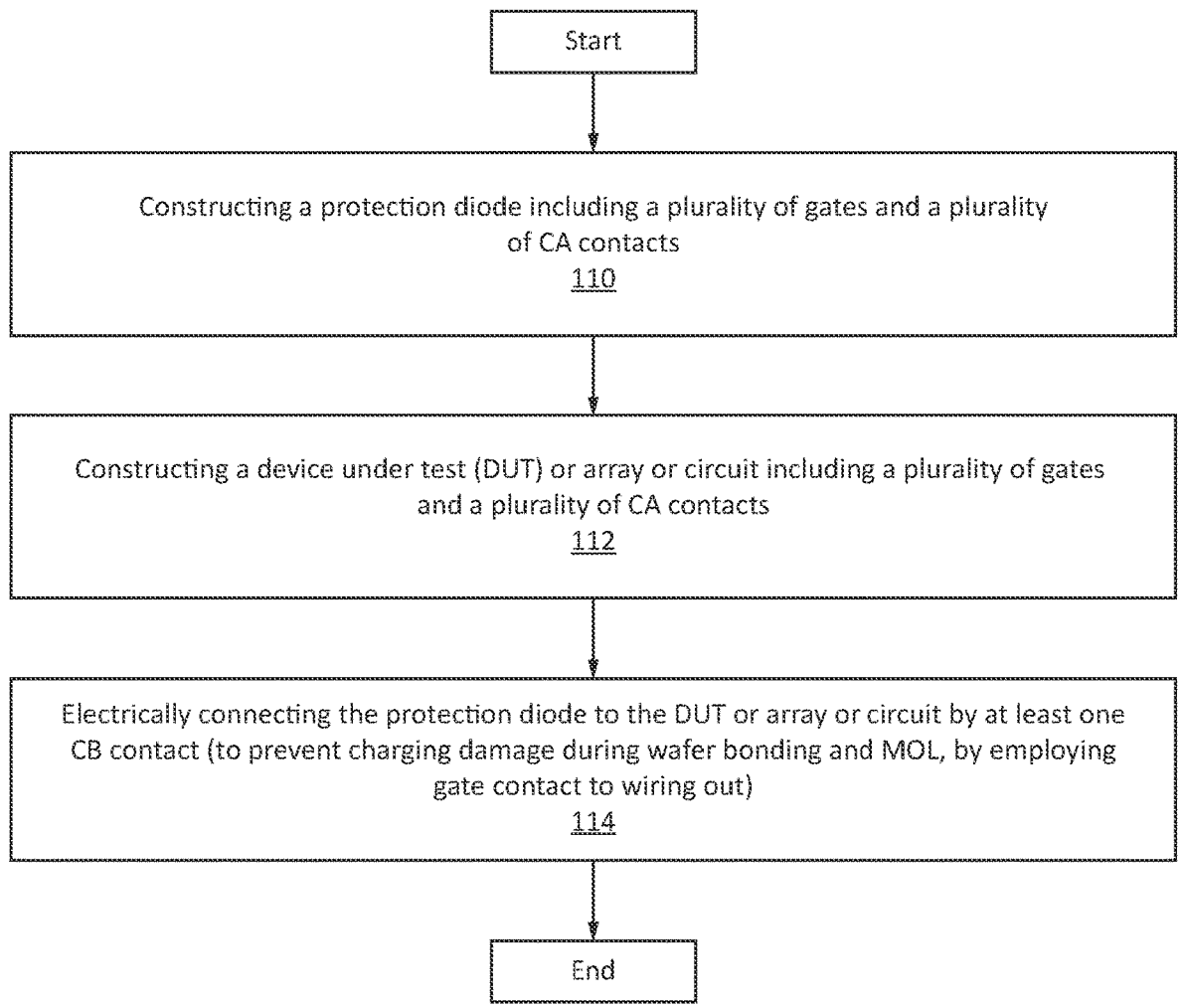
FIG. 6 is a block/flow diagram of a method for employing CB contacts or gate contacts for wiring out (electrical connection between protection diode and DUT or array or circuit), in accordance with an embodiment of the present invention.

FIG. 6 is a block/flow diagram of a method for employing CB contacts or gate contacts for wiring out (electrical connection between protection diode and DUT or array or circuit), in accordance with an embodiment of the present invention.

At block 110, construct a protection diode including a plurality of gates and a plurality of CA contacts.

At block 112, construct a device under test (DUT) or array or circuit including a plurality of gates and a plurality of CA contacts.

At block 114, electrically connect the protection diode to the DUT or array or circuit by using at least one CB contact (to prevent charging damage during wafer bonding and MOL by employing gate contact to wiring out).

Figure 7:
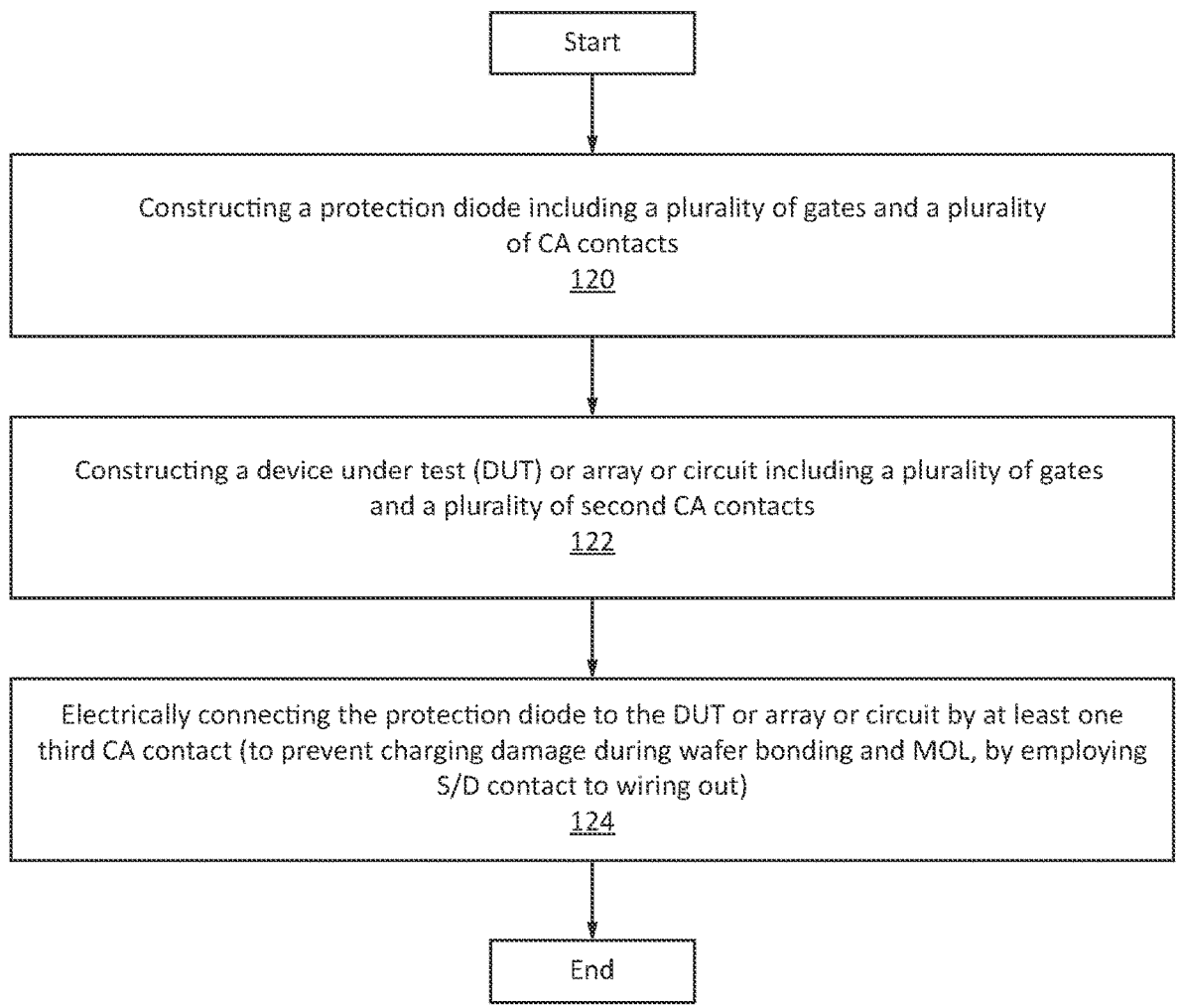
FIG. 7 is a block/flow diagram of a method for employing CA contacts or source/drain (S/D) contacts for wiring out (electrical connection between protection diode and DUT or array or circuit), in accordance with an embodiment of the present invention.

FIG. 7 is a block/flow diagram of a method for employing CA contacts or source/drain (S/D) contacts for wiring out (electrical connection between protection diode and DUT or array or circuit), in accordance with an embodiment of the present invention.

At block 120, construct a protection diode including a plurality of gates and a plurality of first CA contacts.

At block 122, construct a device under test (DUT) or array or circuit including a plurality of gates and a plurality of second CA contacts.

At block 124, electrically connect the protection diode to the DUT or array or circuit by using at least one additional CA contact (to prevent charging damage during wafer bonding and MOL by employing S/D contact to wiring out).

Figure 8:
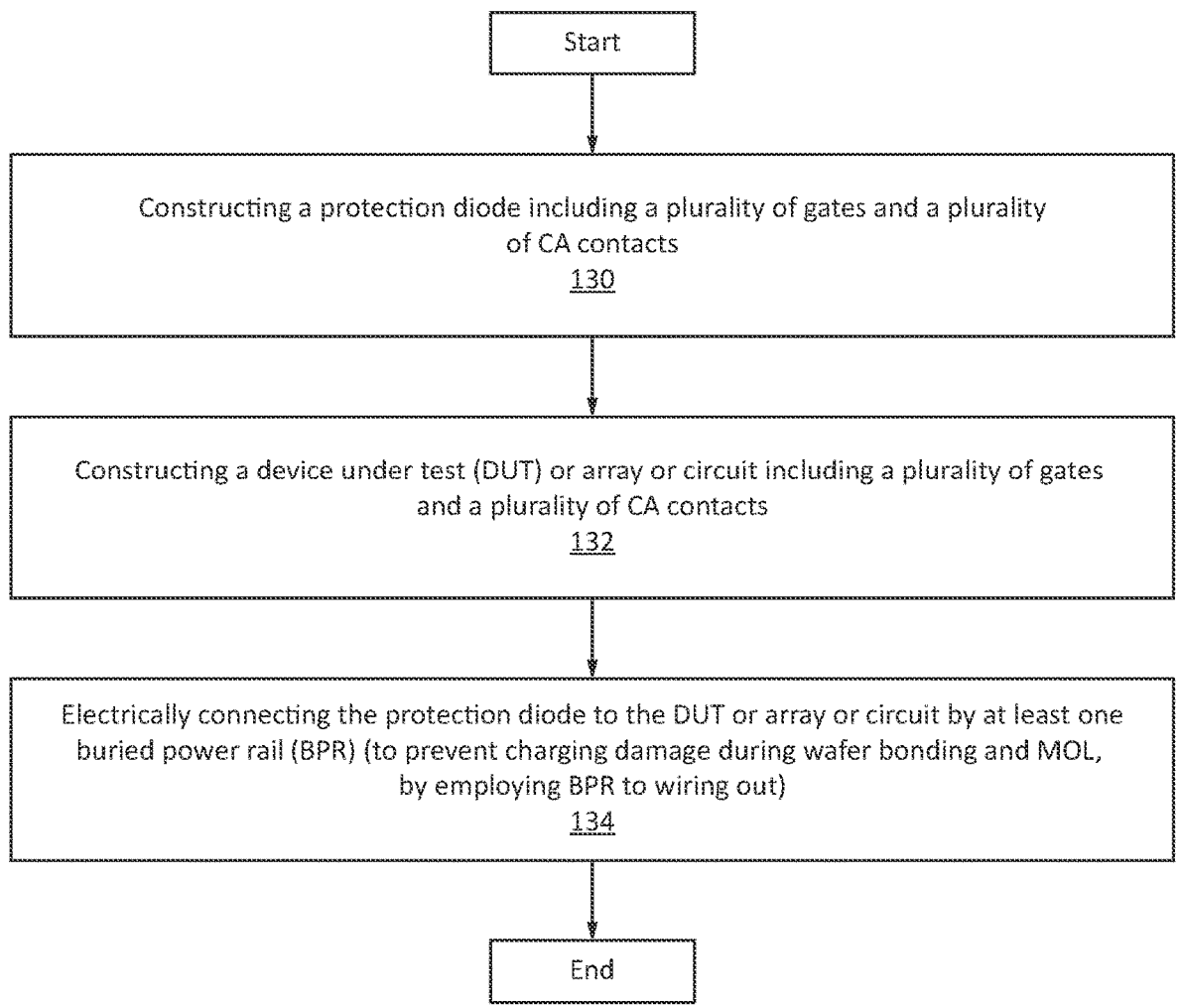
FIG. 8 is a block/flow diagram of a method for employing buried power rails (BPRs) for wiring out (electrical connection between protection diode and DUT or array or circuit), in accordance with an embodiment of the present invention.

FIG. 8 is a block/flow diagram of a method for employing buried power rails (BPRs) for wiring out (electrical connection between protection diode and DUT or array or circuit), in accordance with an embodiment of the present invention.

At block 130, construct a protection diode including a plurality of gates and a plurality of CA contacts.

At block 132, construct a device under test (DUT) or array or circuit including a plurality of gates and a plurality of CA contacts.

At block 134, electrically connect the protection diode to the DUT or array or circuit by using at least one buried power rail (BPR) (to prevent charging damage during wafer bonding and MOL by employing BPR to wiring out).

In conclusion, the exemplary embodiments of the present invention present novel structures where a protection diode is connected to a DUT or array or circuit such that either the gate contact is employed for wiring out or the S/D contact is employed for wiring out or a BPR is employed for wiring out. The protection diode is connected in the MOL (by either CB contact or CA contact or BPR) before M1 formation in order to protect charging from MOL to M1 and to prevent charging damage during wafer bonding and MOL.

Regarding FIGS. 1-5, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Any etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of an integrated circuit for preventing charge damage during wafer bonding and middle-of-line (MOL) processing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An integrated circuit comprising:
a protection diode including a plurality of first gates and a plurality of first source/drain (S/D) contacts; and
a device under test (DUT) including a plurality of second gates and a plurality of second S/D contacts, wherein the DUT is electrically connected to the protection diode by at least one gate contact.

2. The integrated circuit of claim 1, wherein the at least one gate contact includes a first gate contact and a second gate contact.

3. The integrated circuit of claim 2, wherein the first gate contact or one of the first S/D contacts electrically connects to a gate of the plurality of second gates of the DUT.

4. The integrated circuit of claim 2, wherein the second gate contact electrically connects to a S/D contact of the plurality of second S/D contacts of the DUT.

5. The integrated circuit of claim 1, wherein the protection diode is electrically connected to the DUT for gate oxide protection before M1 formation.

6. The integrated circuit of claim 1, wherein MOL layers connecting the protection diode to the DUT pertain to a planar field effect transistor (FET) structure.

7. The integrated circuit of claim 1, wherein MOL layers connecting the protection diode to the DUT pertain to a stacked FET structure.

8. An integrated circuit comprising:
a protection diode including a plurality of first gates and a plurality of first source/drain (S/D) contacts; and
a device under test (DUT) including a plurality of second gates and a plurality of second S/D contacts, wherein the DUT is electrically connected to the protection diode by at least one additional S/D contact.

9. The integrated circuit of claim 8, wherein the at least one additional S/D contact includes a first additional S/D contact and a second additional S/D contact.

10. The integrated circuit of claim 9, wherein the first additional S/D contact electrically connects to a gate of the plurality of second gates of the DUT.

11. The integrated circuit of claim 9, wherein the second additional S/D contact electrically connects to a S/D contact of the plurality of second S/D contacts of the DUT.

12. The integrated circuit of claim 8, wherein the protection diode is electrically connected to the DUT for gate oxide protection before M1 formation.

13. The integrated circuit of claim 8, wherein MOL layers connecting the protection diode to the DUT pertain to a planar field effect transistor (FET) structure.

14. The integrated circuit of claim 8, wherein MOL layers connecting the protection diode to the DUT pertain to a stacked FET structure.

15. An integrated circuit comprising:
a protection diode including a plurality of first gates and a plurality of first source/drain (S/D) contacts; and
a device under test (DUT) including a plurality of second gates and a plurality of second S/D contacts, wherein the DUT is electrically connected to the protection diode by at least one buried power rail (BPR).

16. The integrated circuit of claim 15, wherein the at least one BPR electrically connects to a first end of the plurality of second gates of the DUT.

17. The integrated circuit of claim 15, wherein the at least one BPR electrically connects to a second end of a portion of the plurality of second gates of the DUT.

18. The integrated circuit of claim 15, wherein the protection diode is electrically connected to the DUT for gate oxide protection before M1 formation.

19. The integrated circuit of claim 15, wherein MOL layers connecting the protection diode to the DUT pertain to a stacked FET structure.

20. The integrated circuit of claim 15, wherein MOL layers connecting the protection diode to the DUT pertain to a planar field effect transistor (FET) structure.

* * * * *